United States Patent
Wann et al.

(10) Patent No.: US 6,876,040 B1
(45) Date of Patent: Apr. 5, 2005

(54) DENSE SRAM CELLS WITH SELECTIVE SOI

(75) Inventors: Hsingjen Wann, Carmel, NY (US); Ying Zhang, Yorktown Heights, NY (US); Robert C. Wong, Poughkeepsie, NY (US); An Steegen, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/735,169

(22) Filed: Dec. 12, 2003

(51) Int. Cl.[7] .................. H01L 27/01; H01L 27/12; H01L 31/0392; H01L 29/76; H01L 29/94

(52) U.S. Cl. ................. 257/351; 257/369; 257/903

(58) Field of Search .................. 257/351, 369, 257/903, 904

(56) References Cited

U.S. PATENT DOCUMENTS

| | | | | |
|---|---|---|---|---|
| 5,159,416 A | * | 10/1992 | Kudoh | 257/384 |
| 5,198,683 A | * | 3/1993 | Sivan | 257/67 |
| 5,489,790 A | * | 2/1996 | Lage | 257/330 |
| 5,497,022 A | * | 3/1996 | Sakamoto | 257/377 |
| 5,635,731 A | * | 6/1997 | Ashida | 257/67 |
| 5,734,179 A | * | 3/1998 | Chang et al. | 257/67 |
| 6,204,518 B1 | * | 3/2001 | Adan et al. | 257/67 |
| 6,214,653 B1 | | 4/2001 | Chen et al. | |
| 6,271,542 B1 | * | 8/2001 | Emma et al. | 257/67 |
| 6,333,532 B1 | | 12/2001 | Davari et al. | |

* cited by examiner

*Primary Examiner*—Ngân V. Ngô
(74) *Attorney, Agent, or Firm*—Scully, Scott, Murphy & Presser; Robert M. Trepp, Esq.

(57) ABSTRACT

A SRAM cell fabricated in SSOI (selective silicon on insulator) comprises cross coupled PFET pull-up devices P1, P2 and NFET pull-down devices N1, N2, with the P1, P2 devices being connected to the power supply and the N1, N2 devices being connected to the ground. A first passgate NL is coupled between a first bitline and the junction of the devices P1 and N1, with its gate coupled to a wordline, and a second passgate NR is coupled between a second bitline and the junction of devices P2 and N2, with its gate coupled to the wordline. Each of the pull-up devices P1, P2, the pull-down devices N1, N2, and the first and second passgates NL, NR are fabricated with selective SOI, with buried oxide being selectively provided under the drains of the pull-up devices P1 and P2, the drains of the pull-down devices N1 and N2, and the sources and drains of the passgate devices NL and NR.

9 Claims, 2 Drawing Sheets

SRAM CELL IN SDI
1.302 x 1.897 = 2.47
BETA = 2.32

SRAM CELL IN BULK
1.302 x 1.897 = 2.47
BETA = 1.67

SRAM CELL IN SSDI
1.302 x 1.799 = 2.34
BETA = 1.67

SRAM CELL IN SDI
1.302 x 1.897 = 2.47
BETA = 2.32

DENSE SRAM CELLS WITH SELECTIVE SOI

BACKGROUND OF THE INVENTION

1. Field of the Invention

The present invention relates generally to dense SRAM (Static Random Access Memory) cells fabricated with selective SOI (Silicon On Insulator) which involves the selective placement of buried oxide only in the areas where it is needed, and more particularly pertains to soft error hardened, high speed, low power, dense SRAM cells fabricated with selective SOI and their method of fabrication.

2. Discussion of the Prior Art

SRAM (Static Random Access Memory) cells fabricated with blanket SOI (Silicon On Insulator) provide better soft error immunity (immunity from errors caused by cosmic radiation such as alpha and gamma rays) and faster performance than SRAM cells fabricated in bulk silicon. SRAM cells fabricated with blanket SOI also advantageously allow tighter/closer n+/p+ spacing, as shown in FIGS. 1–3 herein, for more compact memory cell layouts. However, the SRAM cell size is not reduced when the SRAM cell design in bulk silicon is migrated or transferred to a SRAM cell design in SOI, as shown in FIGS. 1–3. Moreover, the effect of the floating (not coupled to a reference voltage or ground) bodies of the passgate devices (the silicon above the insulator is not coupled to ground in SOI as in bulk silicon) of the SRAM memory cells in SOI make the SRAM cells more susceptible to access disturbs than SRAM cells fabricated in bulk silicon. The floating bodies of the passgate devices in SOI degrade the cell stability because the passgate devices are more conductive in SOI than in bulk silicon. The unselected SRAM memory cells along a selected wordline in SOI can erroneously change states more easily because the down node (connected to ground) can be pulled up more easily through the passgate devices. The floating bodies of the pull-up and pull-down devices also tend to make the off devices turn on more easily in SOI than in bulk silicon.

Thus SRAM cells fabricated in bulk silicon may have a beta ratio <1.5, while SRAM cells fabricated in blanket SOI must have a beta ratio >2.1. The beta ratio here refers to the ratio of electrical W/L (Width/Length ratio) of the pull-down NFETs compared to the electrical W/L of the passgate NFETs. When the design of a SRAM cell fabricated in bulk silicon is migrated or transferred to the design of a SRAM cell fabricated in SOI, the flexibility of an active well is also lost. An active well is necessary for control of the SRAM cell circuit speed and off currents. An active well can be moved/biased up and down in voltage to control the circuit speed and off currents, whereas in SOI the well floats and cannot be moved/biased up and down in voltage.

FIG. 1 illustrates the layout of a SRAM cell fabricated in bulk silicon, and shows the PC (polysilicon conductor) and RX (active silicon conductor regions which are isolated by trench isolation regions) areas and regions of the chip and the M1 metal level (the first and lowest metal level). FIG. 2 illustrates the layout of a SRAM cell fabricated in blanket SOI, and shows the PC and RX areas and regions of the chip and the M1 metal level. FIG. 3 illustrates a simplified version of FIG. 2, and shows only the PC and RX areas and regions of the chip, and the M1 metal level is not shown.

All dimensions shown in FIGS. 1–5 are in microns, and the bottom of FIGS. 1–4 also show the dimensions in microns of the overall layout dimensions of each SRAM cell.

FIG. 1 illustrates a top plan view of a circuit layout of a prior art 90 nm node technology SRAM cell fabricated in bulk silicon. FIG. 1 illustrates only the PC (polysilicon conductor) areas, the RX (active silicon conductor regions which are isolated by trench isolation regions) regions, and the M1 (first metal) level of the chip, and the M2 and M3 (second and third metal) levels are not shown.

The prior art 90 nm node technology SRAM cell is fabricated in a base PC (Polysilicon Conductor) level, the overlying bottom M1 metal level, the next higher metal level M2, and the next higher metal layer M3. The prior art 90 nm node technology SRAM cell is fabricated with a PC level wordline WL and an M2 metal level ground, VDD power supply and bitlines BLs. For large SRAM cell arrays, the PC level is not an efficient enough conductor for the global wordlines, and the M3 metal level must be used for the global wordlines.

FIG. 5 illustrates a circuit schematic of a SRAM cell fabricated in either bulk silicon, blanket SOI or SSOI. The circuit of the SRAM cell is well known and includes cross coupled pnp pull-up devices P1, P2 and npn pull-down devices N1, N2, with the P1, P2 devices being connected to the power supply VDD, and the N1, N2 devices being connected to ground GND. The left npn passgate device NL is coupled between the left bitline BL and the junction of devices P1 and N1, with its gate coupled to the wordline WL. The right npn passgate device NR is coupled between the right bitline BR and the junction of devices P2 and N2, with its gate coupled to the wordline WL.

Referring to FIG. 1 which illustrates a SRAM cell fabricated in bulk silicon and to FIG. 2 which illustrates a SRAM cell fabricated in SOI, the PC level wordline WL extends generally horizontally across the lower portion of the chip and crosses left and right legs of a bottom M shaped RX (active silicon conductor) region, with the crossing on the left defining the passgate device NL, with the WL defining the gate G and the RX region defining the source S and drain D regions of the passgate NL, and with the crossing on the right defining the passgate device NR, with the WL defining the gate G and the RX region defining the source S and drain D regions of the passgate device NR.

Left and right PC (Polysilicon Conductor) regions extend vertically on opposite left and right portions of the chip as shown in FIGS. 1 and 2.

The top horizontal portion of the bottom M shaped RX region crosses the left PC region and defines the pulldown device N1, with the left PC region defining the gate G and the RX region defining the drain D and source S regions of the pulldown device N1. The top horizontal portion of the M shaped RX region crosses the right PC region and defines the pulldown device N2, with the right PC region defining the gate G and the RX region defining the source S and drain D regions of the pulldown device N2, with a common source region S between the pulldown devices N1 and N2.

A horizontal base of a top W shaped RX (active silicon conductor) region crosses the upper portions of the left and right PC regions.

The bottom horizontal portion of the top W shaped RX region crosses the left PC region and defines the pullup device P1, with the left PC region defining the gate G and the RX region defining the drain D and source S regions of the pullup device P1. The bottom horizontal portion of the W shaped RX region crosses the right PC region and defines the pullup device P2, with the right PC region defining the gate G and the RPX region defining the source S and drain D regions of the pullup device P2, with a common source region S between the pullup devices P1 and P2.

In the design and layout of FIG. 2, the beta ratio has been increased, relative to the design and layout of FIG. 1, from 1.67 to 2.32, with the pull down device width labeled PDW, being increased from 0.266 to 0.364 microns. To maintain the same cell size, the n+/p+ spacing, labeled n+p+S, is reduced to 0.406 from 0.504 microns, while also reducing the M1 metal level dimensions somewhat. The smaller n+/p+ spacing is possible because SOI helps to isolate the deep well leakage.

SUMMARY OF THE INVENTION

The present invention provides dense SRAM cells fabricated with selective SOI (SSOI) that involves the selective placement of buried oxide only in the areas where it is needed, as opposed to blanket SOI that provides SOI everywhere across the chip. A SRAM cell fabricated in SSOI comprises cross coupled PFET pull-up devices P1, P2 and NFET pull-down devices N1, N2, with the P1, P2 devices being connected to the power supply and the N1, N2 devices being connected to the ground. A first passgate NL is coupled between a first bitline and the junction of the devices P1 and N1, with its gate coupled to a wordline, and a second passgate NR is coupled between a second bitline and the junction of devices P2 and N2, with its gate coupled to the wordline. Each of the pull-up devices P1, P2, the pull-down devices N1, N2, and the first and second passgates NL, NR are fabricated with selective SOI, with buried oxide being selectively provided under the drains of the pull-up devices P1 and P2, the drains of the pull-down devices N1 and N2, and the sources and drains of the passgate devices NL and NR.

BRIEF DESCRIPTION OF THE DRAWINGS

The foregoing objects and advantages of the present invention for dense SRAM cells with selective SOI may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

The present invention provides improved SRAM cell designs fabricated in SSOI (selective SOI). Selective SOI involves the selective placement of buried oxide selectively only in the areas where it is needed, as opposed to blanket SOI that provides SOI everywhere across the chip. There are many ways to achieve selective SOI. One example is to use a masked SIMOX (separation by implantation of oxygen) implant as disclosed in U.S. Pat. No. 6,333,532 for Patterned SOI Regions in Semiconductor Chips. Another example is to grow amorphous Si over the substrate already with oxide patterns, and then recrystalize the amorphous Si to make FETs as disclosed in U.S. Pat. No. 6,214,653 for Method for Fabricating CMOS Devices on a Mixed Bulk and SOI Substrate.

Pursuant to the teachings of the present invention, these SSOI selective SOI processes are utilized to provide SRAMs in SSOI which are more stable, and provide faster and cooler operations at a higher density than SRAMs in either bulk silicon or in blanket SOI.

Figure 5:
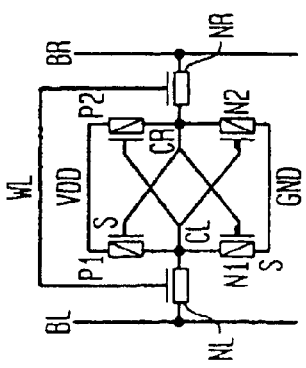
FIG. 5 illustrates a circuit schematic of a SRAM cell fabricated in either bulk silicon, blanket SOI or SSOI.
Figure 2:
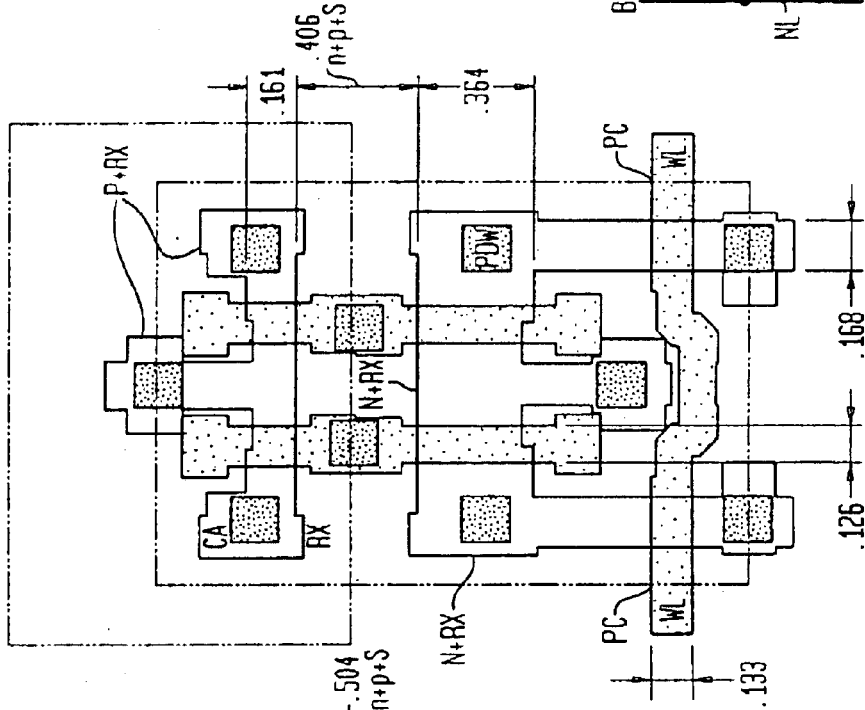
FIG. 2 illustrates the layout of a prior art SRAM cell fabricated in blanket SOI, and shows the PC and RX areas and regions of the chip and the M1 metal level.
Figure 4:
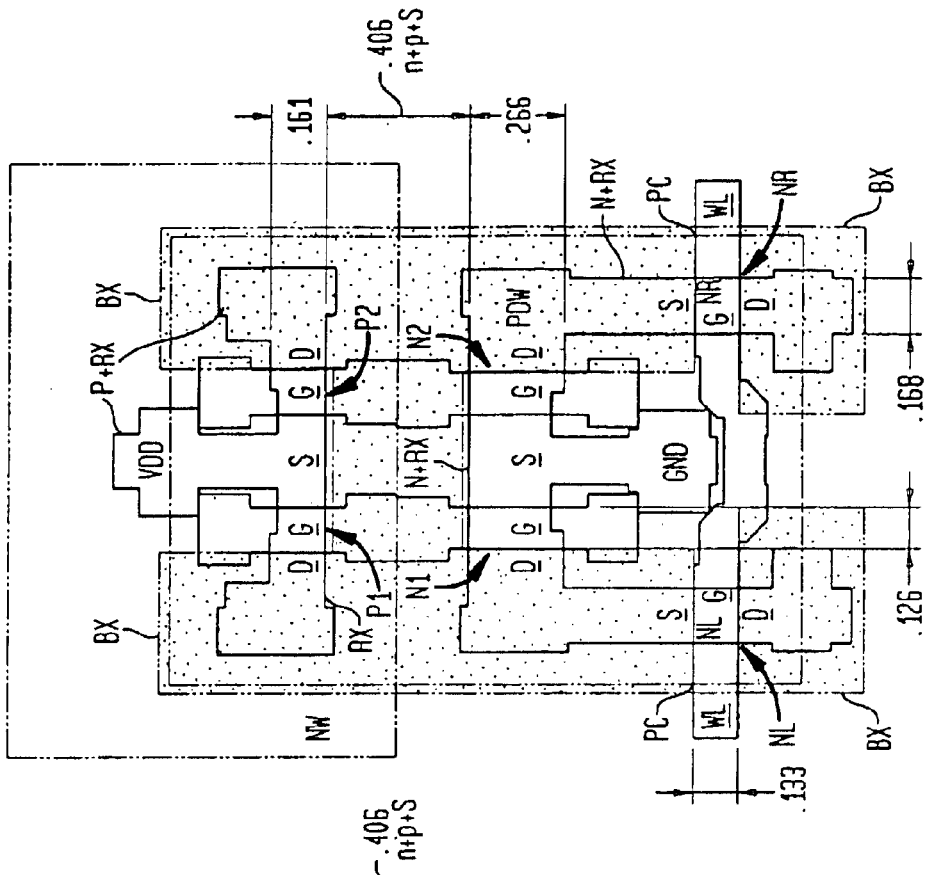
FIG. 4 illustrates an embodiment of a SRAM cell in SSOI pursuant to the present invention that is similar to FIG. 2 by showing the PC and RX areas and regions and the M1 metal level.
Figure 3:
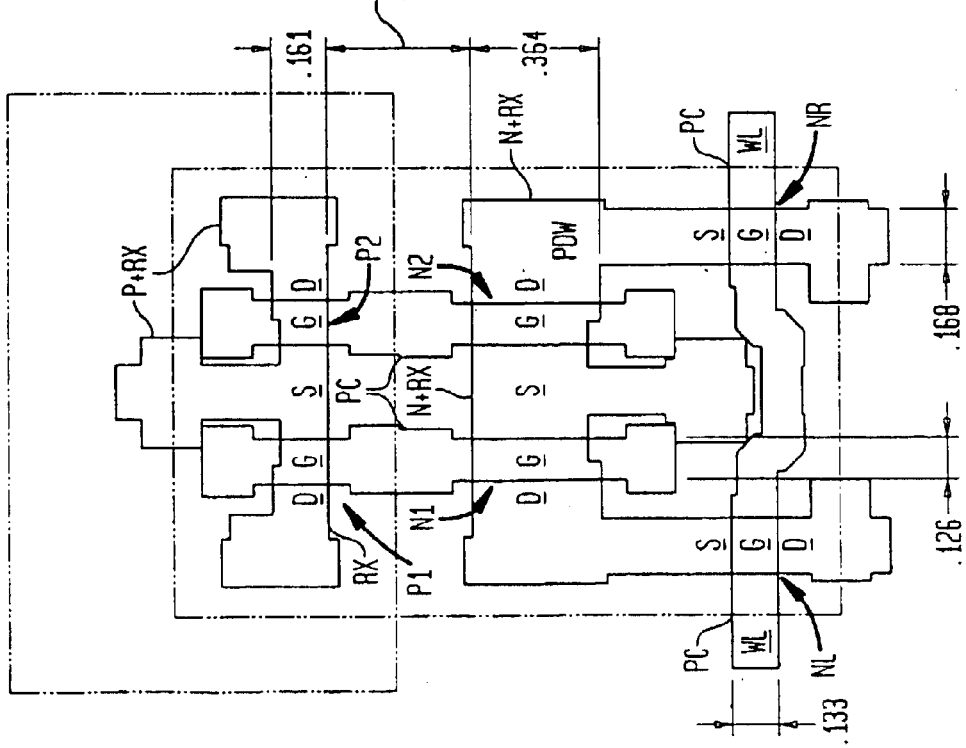
FIG. 3 illustrates a simplified version of FIG. 2, and shows only the PC and RX areas and regions of the chip, and the M1 metal level is not shown.

FIG. 4 illustrates the layout of an embodiment of a SRAM cell in SSOI pursuant to the present invention that is similar to the layout of FIG. 2 in that it shows the PC and RX areas and regions and the M1 metal level. The layout of the SRAM cell fabricated in SSOI is similar to the layouts of the SRAM cells fabricated in bulk silicon and in SOI. Referring to FIG. 4, in that layout, a PC level wordline WL extends generally horizontally across the lower portion of the chip and crosses left and right legs of a bottom M shaped RX (active silicon conductor) region, with the crossing on the left defining the passgate device NL, with the WL defining the gate G and the RX region defining the source S and drain D regions of the passgate NL, and with the crossing on the right defining the passgate device NR, with the WL defining the gate G and the RX region defining the source S and drain D regions of the passgate device NR.

Left and right PC (Polysilicon Conductor) regions extend vertically on opposite left and right portions of the chip.

The top horizontal portion of the bottom M shaped RX region crosses the left PC region and defines the pulldown device N1, with the left PC region defining the gate G and the RX region defining the drain D and source S regions of the pulldown device N1. The top horizontal portion of the M shaped RX region crosses the right PC region and defines the pulldown device N2, with the right PC region defining the gate G and the RX region defining the source S and drain D regions of the pulldown device N2, with a common source region S between the pulldown devices N1 and N2.

A horizontal base of a top W shaped RX (active silicon conductor) region crosses the upper portions of the left and right PC regions.

The bottom horizontal portion of the top W shaped RX region crosses the left PC region and defines the pullup device P1, with the left PC region defining the gate G and the RX region defining the drain D and source S regions of the pullup device P1. The bottom horizontal portion of the W shaped RX region crosses the right PC region and defines the pullup device P2, with the right PC region defining the gate G and the RX region defining the source S and drain D regions of the pullup device P2, with a common source region S between the pullup devices P1 and P2.

FIG. 4 illustrates an upper rectangle labeled NW which indicates that all areas within the NW rectangle have a blanket of N well diffusion under the SRAM cell, with the blanket of N well diffusion having periodic contacts to VDD, and all areas outside of the NW rectangle have a blanket of P well diffusion under the SRAM cell, with the blanket of P well diffusion having periodic contacts to ground GND.

The selective SOI areas are shown in FIG. 4 as the shaded BX areas, where BX stands for Buried Oxide.

The SOI for the pull-up and pull-down devices is one-sided. The VDD voltage supply, source S sides of the pull-up PFETs P1 and P2 and the GND ground, source S sides of the pull-down NFETs N1 and N2 are not not moving nodes, and so need not be sealed by the SOI. Node capacitance at those non-moving nodes will not adversely affect circuit performance, and in fact contributes to the stability of the circuit.

All six FETs of the SRAM cell fabricated in SSOI technology have bodies that can be biased by being coupled to the voltage supply VDD or to ground GND through the underlying N well or the underlying P well. The sources S of the pull-up devices P1 and P2 are coupled to the voltage supply VDD, the sources S of the pull-down devices N1 and N2 are coupled to ground GND, and the channels under the gates G of the passgates NL and NR are biased/touched to GND through the underlying P well, Both the pull-up devices P1 and P2 and the pull-down devices N1 and N2 are provided with selective SOI under the drain D regions as the SOI reduces the capacitance of the drain D to allow the potential on the drain D to be moved/ changed faster to increase the circuit speed. The sources S of the pull-up devices P1 and P2 are biased/coupled to VDD, while the sources S of the pull-down devices P1 and P2 are biased/coupled to ground GND, and so the potential of the sources S does not move/change, and so a lesser capacitance is not required. Moreover, a greater capacitance at the sources S aids the stability of the SRAM cell, and so selective SOI is not provided under the sources S of both the pull-up devices P1 and P2 and the pull-down devices N1 and N2. The channels under the gates G of the pull-up devices P1 and P2 should be biased/touched to VDD of the underlying N well, and the channel under the gates G of the pull-down devices N1 and N2 should be biased/touched to GND of the underlying P well, and so selective SOI is also not provided under the gates G of both the pull-up devices P1 and P2 and the pull-down devices N1 and N2.

The passgates NL and NR are provided with selective SOI under the drain D regions and source S regions as the SOI reduces the capacitance of the drain D and source S to allow the potential on the drain D and source S to be moved/ changed faster to increase the circuit speed. The channels under the gates G of the passgates NL and NR should be biased/touched to GND of the underlying P well, and so selective SOI is not provided under the gates G of the passgates NL and NR.

The SRAM cell illustrated in FIG. 4 and fabricated in SSOI technology shows that if the floating bodies of the six FET devices of the SRAM cell can be biased by being coupling to either the voltage supply VDD or ground GND, the cell beta ratio can be low, while the n+/p+ spacing can be small because of the isolation provided by the SOI.

Figure 1:
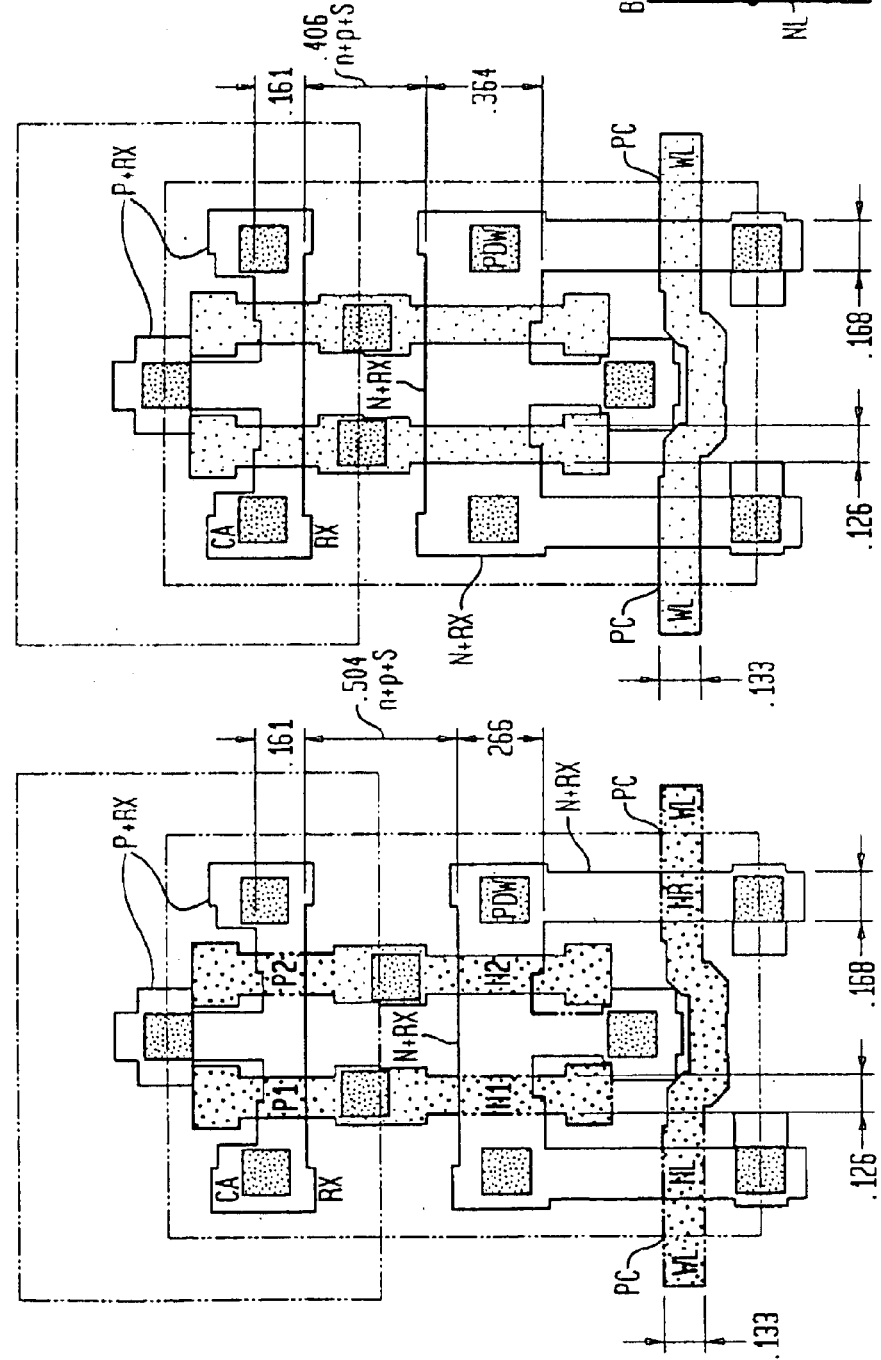
FIG. 1 illustrates the layout of a prior art SRAM cell fabricated in bulk silicon, and shows the PC and RX areas and regions of the chip and the M1 metal level.

The pull-down NFETs N1 and N2 are now smaller than the pull-down NFETs N1 and N2 in SOI, having a width of 0.266 microns as opposed to 0.364 microns, similar to the case of the bulk silicon layout of FIG. 1, since there are no concerns of floating bodies. The n+/p+ spacing is reduced relative to FIG. 1, from 0.504 to 0.406 microns, since there is SOI isolation.

The present invention provides an SRAM design that offers the benefits of both bulk silicon and SOI by selectively placing buried oxide Bx only in those areas where it is needed, in the drain D regions of the pull-up devices P1 and P2, in the drain D regions of the pull-down devices N1 and N2, and in the source S and drain D regions of the passgate devices NL and NR.

The SRAM cells fabricated in SSOI pursuant to the present invention:

provide additional possible benefits because the floating bodies can now be the active wells;

are more hardened against radiation or soft errors than SRAM cells in bulk silicon since the moving nodes are mainly shielded by SOI;

provide faster operation than SRAM cells in bulk silicon because of the reduced capacitance;

can provide even faster operation than SRAM cells in SOI since the device bodies can now be biased for higher device currents (the N well can be biased to a voltage above VDD, and the P well can be biased to a voltage below GND);

have lower power dissipation than SRAM cells in bulk silicon and SOI because the voltage bias of the device bodies can be adjusted to minimize off currents;

are denser than SRAM cells in bulk silicon or SOI, since the n+/p+ spacing can be reduced while the beta ratio is kept small. In the example of FIG. 4, the density gain is about 5% (2.34 microns$^2$ with respect to 2.47 microns$^2$) relative to bulk silicon or SOI.

While several embodiments and variations of the present invention for dense SRAM cells with selective SOI are described in detail herein, it should be apparent that the disclosure and teachings of the present invention will suggest many alternative designs to those skilled in the art.

What is claimed is:

1. A SRAM cell fabricated in SSOI (selective silicon on insulator) comprising:

cross coupled pnp pull-up devices P1, P2 having sources, drains and gates and npn pull-down devices N1, N2 having sources, drains and gates, with the P1, P2 devices being connected to a power supply and the N1, N2 devices being connected to a ground;

a first passgate NL coupled between a first bitline and the junction of devices P1 and N1, with its gate coupled to a wordline, and a second passgate NR coupled between a second bitline and the junction of devices P2 and N2, with its gate coupled to the wordline, and the passgates having sources, drains and gates:

wherein each of the pull-up devices P1, P2, the pull-down devices N1, N2, and the first and second passgates NL, NR are fabricated with their sources, drains and gates being selectively provided with SOI or being fabricated over bulk silicon without SOI, with the drains of the pull-up devices P1 and P2 and the pull-down devices N1 and N2 being provided with selective SOI to reduce the capacitance of the drains to allow the potential of the drains to be moved/changed faster to increase the circuit speed.

2. The SRAM cell of claim 1, wherein the voltage supply, source sides of the pull-up devices P1 and P2 and the ground, source sides of the pull-down devices N1 and N2 are fabricated over bulk silicon without SOI.

3. The SRAM cell of claim 2, wherein channels under the gates of the pull-up devices P1 and P2 are biased/touched to VDD of an underlying N well and are fabricated over bulk silicon without SOI.

4. The SRAM cell of claim 3, wherein channels under the gates of the pull-down devices N1 and N2 are biased/ touched to ground of an underlying P well and are fabricated over bulk silicon without SOI.

5. The SRAM cell of claim 1, wherein each of the pull-up devices P1, P2, the pull-down devices N1, N2, and the first and second passgates NL, NR have bodies that are biased by being biased/coupled to the voltage supply or to ground through an underlying N well or an underlying P well.

6. The SRAM cell of claim 1, wherein the sources of the pull-up devices P1 and P2 are coupled to the voltage supply, the sources of the pull-down devices N1 and N2 are coupled to ground, and the gates of the passgate devices NL and NR are biased/coupled to ground through an underlying P well.

7. The SRAM cell of claim 1, wherein the drains and the sources of the passgates NL and NR are provided with selective SOI to reduce the capacitance of the drains and sources to allow the potential of the drains and sources to be moved/changed faster to increase the circuit speed.

8. The SRAM cell of claim 1, wherein channels under the gates of the passgates NL and NR are biased/touched to ground of an underlying P well.

9. The SRAM cell of claim 4, fabricated with selectively placed buried oxide under the drains of the pull-up devices P1 and P2, the drains of the pull-down devices N1 and N2, and the sources and drains of the passgate devices NL and NR.

* * * * *